United States Patent [19]

Okamoto et al.

[11] Patent Number: 4,665,608
[45] Date of Patent: May 19, 1987

[54] METHOD OF MANUFACTURING SEMICONDUCTOR DEVICES

[75] Inventors: Tatsuo Okamoto; Hiroshi Harada, both of Itami, Japan

[73] Assignee: Mitsubishi Denki Kabushiki Kaisha, Tokyo, Japan

[21] Appl. No.: 682,594

[22] Filed: Dec. 14, 1984

[30] Foreign Application Priority Data

Dec. 20, 1983 [JP] Japan ................. 58-242631

[51] Int. Cl.$^4$ .............................. H01L 21/312
[52] U.S. Cl. .................... 29/571; 29/576 C; 29/577 C; 29/578; 357/23.15; 427/93; 148/DIG. 14; 148/DIG. 43; 148/DIG. 81; 148/DIG. 118; 148/DIG. 147
[58] Field of Search ............ 29/571, 576 C, 577 C, 29/578; 357/23.6, 23.15, 54, 67 S, 71 S; 427/79, 88, 93, 255.4; 148/DIG. 14, DIG. 43, DIG. 81, DIG. 118, DIG. 147

[56] References Cited

U.S. PATENT DOCUMENTS

| | | | |
|---|---|---|---|
| 3,614,548 | 10/1971 | Inoue | 357/23.6 X |
| 4,285,761 | 8/1981 | Fatula, Jr. et al. | 29/571 X |
| 4,419,142 | 12/1983 | Matsukawa | 29/571 X |
| 4,432,006 | 2/1984 | Takei | 357/23.6 |

OTHER PUBLICATIONS

Murarka, S. P., "Refractory Silicides for Integrated Circuits" in *J. Vac. Sci. Technol.* 17(4), Jul./Aug. 1980, pp. 775–792.

Laibowitz, R. B., "Fabrication of Vias in a Multilayered Metallization in LSI Technology" in *IBM Tech. Disc. Bull.* 21(12), May 1979, pp. 5051–5052.

*Primary Examiner*—Brian E. Hearn
*Assistant Examiner*—John T. Callahan
*Attorney, Agent, or Firm*—Lowe Price LeBlanc Becker & Shur

[57] ABSTRACT

A method of manufacturing a semiconductor device comprises a step of preparing a semiconductor substrate (12) having a surface layer of silicon, a step of forming a conductive thin film (14) of a silicide composed of a metal having a high melting point and silicon on the semiconductor substrate (12), a step of forming an oxidation-resistant mask (18) on a first portion (14a) of the conductive thin film (14) and a step of converting a second, exposed, portion (19) of the conductive thin film (14) into an insulating film (19a) of a composite oxide composed of silicon oxide and an oxide of the subject metal by oxidizing the exposed portion (19) while maintaining the first portion (14a) of the conductive thin film (14) covered by the mask (18).

14 Claims, 11 Drawing Figures

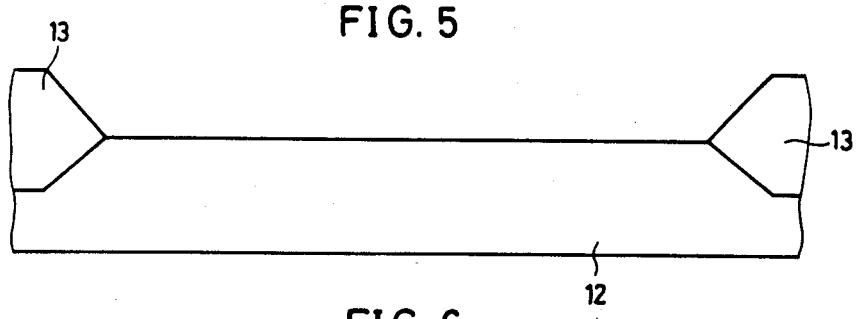
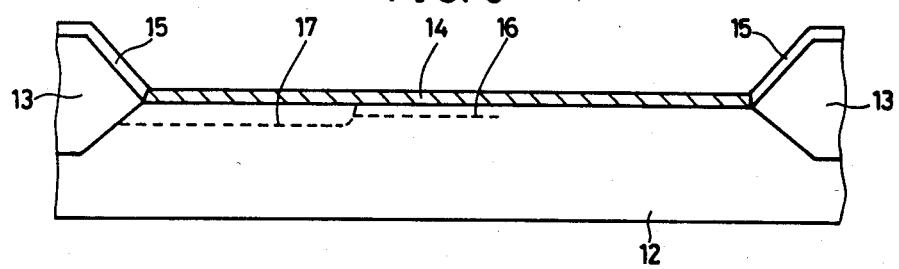
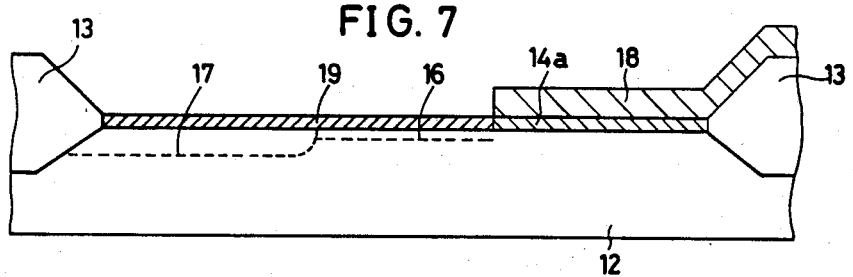
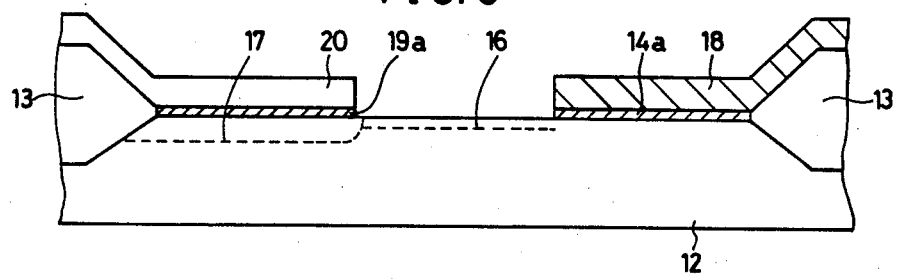

METHOD OF MANUFACTURING SEMICONDUCTOR DEVICES

BACKGROUND OF THE INVENTION

1. Field of the Invention

The present invention relates to a method of manufacturing semiconductor devices, in which two kinds of conductive and insulating thin films are formed on a semiconductor substrate.

2. Description of the Prior Art

In such a semiconductor device comprising two kinds of conductive and insulating thin films formed on a semiconductor substrate, the conductive thin film is utilized as a wiring layer or as the material for reducing the resistance while the insulating film is used as the insulating material or the dielectric material.

When the insulating film is to be applied as the dielectric material, there is generally employed a film of silicon dioxide ($SiO_2$) and when the conductive film is to be applied as the wiring layer, there is generally employed an aluminum layer or a polycrystalline silicon layer.

As a semiconductor device comprising conductive and insulating thin films formed on a semiconductor substrate, for example, there have been provided semiconductor memory devices called dynamic random access memory (hereinafter referred to as D-RAM) in which a plurality of memory cells each consisting of a MOS field effect transistor and a capacitor are formed on a substrate. In the D-RAM, the insulating film is employed as the dielectric material for the capacitor while the conductive film is applied as a wiring layer.

In recent years, such D-RAMs are subjected to high scales of integration, i.e., fine construction, and thus reduction of areas in which the capacitors are formed. For preventing malfunction of such D-RAMs, there have been proposed D-RAMs employing composite oxide as the dielectric material for the capacitor, which comprises silicon dioxide and an oxide of a metal having a high melting point such as tantalum, in order to increase the storage amount of electric charges. The dielectric constant of such a metal oxide is over twice as large as that of silicon dioxide. Examples of such D-RAMs are disclosed in "Interfacial Oxidation of $Ta_2O_5$-Si Systems for High-Density D-RAM" by T. Kato et al; 1983 Symposium on VLSI Technology, page 86 and Japanese Patent Laying-Open Gazette No. 24541/1982.

FIG. 4 is a cross-sectional view of the D-RAM as disclosed in the Japanese Patent Laying-Open Gazette No. 24541/1982. In the D-RAM as shown in FIG. 4, a MOS field effect transistor is formed with a drain portion 8 and a source portion 9 both provided on one main surface of a p-type silicon substrate 1 and a gate electrode 7a consisting of a polycrystalline silicon film provided on the upper surface of a silicon dioxide film 6, and a capacitor is formed with the p-type silicon substrate 1, a composite oxide film 5 composed of tantalum oxide and silicon oxide and a polycrystalline silicon film 7b, while wiring layers are formed with aluminum thin films 11a and 11b.

In a method of manufacturing the D-RAM having the aforementioned structure, a silicon dioxide thin film 3 is formed on the upper surface of a p-type silicon substrate 1 which is provided with a thick field oxide film 2, and a tantalum thin film 4 is formed by sputtering on the upper surface of the silicon dioxide film 3 as shown in FIG. 1.

Then, as shown in FIG. 2, the silicon dioxide film 3 and the tantalum thin film 4 are selectively removed in a desired pattern by a photo etching method and thermal processing is performed to convert the residual portions of the silicon dioxide thin film 3 and the tantalum thin film 4 into a composite oxide film 5, while a silicon dioxide thin film 6 is formed on the exposed portion of the silicon substrate 1.

Then, as shown in FIG. 3, a polycrystalline silicon thin layer serving as a gate electrode 7a of a MOS field effect transistor and one electrode 7b of a capacitor is formed in the selected pattern, followed by formation of a drain portion 8 and a source portion 9 by ion implantation with about 80 KV.

Thereafter a silicon dioxide thin film 10 is formed over the entire surface of the substance, with contact holes formed in portions of the silicon dioxide thin film 6 located on the drain portion 8 and the source portion 9, followed by formation of a wiring layer 11a of an aluminum thin film to be connected with the source portion 9 and a wiring layer 11b of an aluminum thin film to be connected with the drain portion 8, thereby to obtain a substance in the structure as shown in FIG. 4.

However, while the storage capacity of the capacitor is increased in the D-RAM having the aforementioned structure, there are required steps of forming the dielectric material portion of the capacitor alone, i.e., the step of forming the silicon dioxide thin film 3, the step of forming the tantalum thin film 4 and a step of performing mask alignment etc., leading to increase in the number of the steps.

With respect to the MOS field effect transistor, on the other hand, there is proposed in Japanese Patent Laying-Open Gazette No. 88783/1979 employment of a laminated foil formed by providing a film of a silicide of a metal having a high melting point on a polycrystalline silicon film as a wiring layer to be connected to each of a gate electrode and a source portion.

Then the laminated foil of the silicide of the metal having a high melting point provided on the polycrystalline silicon film as proposed by the Japanese Patent Laying-Open Gazette No. 88783/1979 is applied to the wiring layer 11a to be connected with the source portion 9 (and the wiring layer 11b to be connected with the drain portion 8) in the aforementioned Japanese Patent Laying-Open Gazette No. 24541/1982, the polycrystalline silicon layer and the layer of the metal silicide are formed after formation of the MOS-type transistor and the capacitor, whereby the steps are further increased in number.

SUMMARY OF THE INVENTION

An essential object of the present invention is to provide a method of readily forming an insulating film having a high dielectric constant and a conductive film on a semiconductor substrate.

The method of manufacturing semiconductor devices in accordance with the present invention includes a step of forming a thin conductive film of a silicide of a metal having a high melting point, a step of forming an oxidation-resistant mask on the silicide film and a step of forming an insulating composite oxide film composed of silicon oxide and oxide of the metal by oxidizing an exposed portion of the silicide film while maintaining the other portion of the same covered by the mask to be conductive. Thus, there is provided a method of readily forming a conductive film and an insulating film on a semiconductor substrate, resultant materials of which are different compounds of the same metal.

The above and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 11 are cross-sectional views showing a method of manufacturing a semiconductor device according to an embodiment of the present invention in order of the steps performed.

DESCRIPTION OF THE PREFERRED EMBODIMENT

Figure 1:
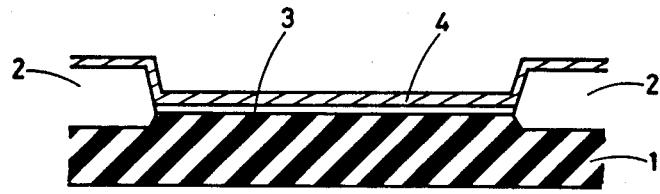
FIGS. 1 to 4 are cross-sectional views showing a conventional method of manufacturing a D-RAM as shown in FIG. 4 in order of the steps performed.
Figure 2:
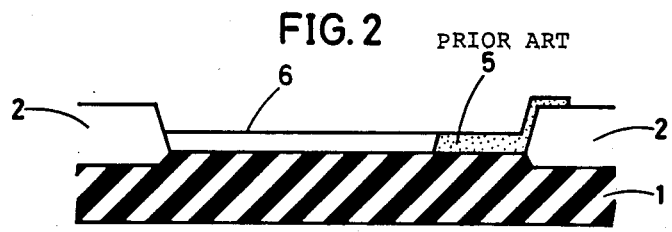
Figure 3:
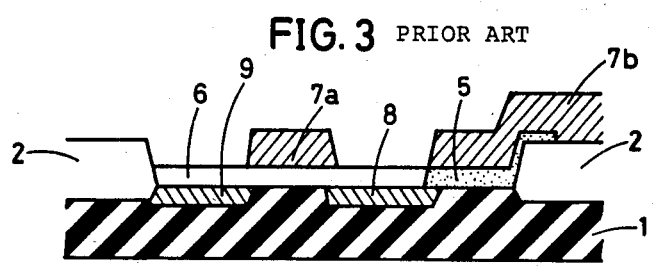
Figure 4:
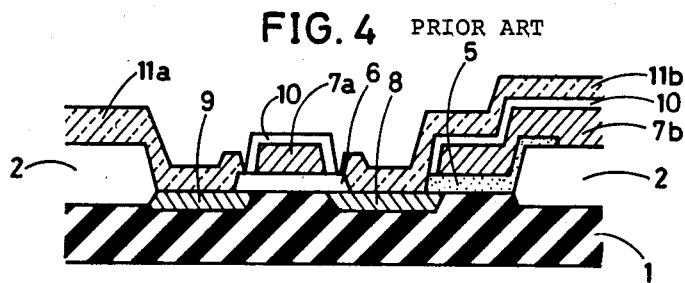

With reference to FIGS. 5 to 11, description is now made on an embodiment of a method in accordance with the present invention, which is applied to a D-RAM. It is to be noted that, in the present embodiment, a conductive thin film formed on a semiconductor substrate corresponds to a thin film adapted to reduce the resistance of a bit line region serving also as a source region in a MOS-type transistor of a D-RAM, and an insulating thin film corresponds to a dielectric material layer of a capacitor in the D-RAM.

First, as shown in FIG. 5, a thick field oxide film 13 is provided in a desired pattern on one main surface of a semiconductor substrate 12 of a p-type silicon.

Then, as shown in FIG. 6, a thin film of titanium (Ti), which is a metal having a high melting point, is formed about 400 to 500 Å in thickness by a method such as sputtering or electron beam evaporation (EB), and the substance thus obtained is heated in a non-oxidation atmosphere of about 600° to 700° C. At this time, titanium provided on the exposed surface of the semiconductor substrate 12 is combined with silicon of the substrate 12 to be converted into a conductive silicide composed of titanium and silicon to present a titanium silicide film (TiSi$_x$) 14 and the titanium portion 15 provided on the upper surface of the field oxide film 13 remains in a non-reacted state. Thereafter, for determining V$_{TH}$ of a MOS field effect transistor in the D-RAM, p-type impurities are injected by ion implantation to the main surface of the semiconductor substrate 12, at a portion on which a gate electrode of the MOS-type transistor is to be provided, to form a p-type impurity layer 16, while, for increasing the capacity of a capacitor in the D-RAM, n-type impurities are injected by ion implantation to another portion of the main surface in a region for forming the capacitor to obtain a p-n junction 17. Then the titanium thin film 15 on the field oxide film 13 is removed. At this time, the titanium thin film 15 alone is removed in a self-aligning manner, since the titanium thin film 15 on the field oxide film 13 and the titanium silicide film 14 on the exposed surface of the semiconductor substrate 12 are different in material from each other.

Then, as shown in FIG. 7, an oxidation-resistant mask 18 of a silicon nitride film is formed on the upper surface of the titanium silicide film 14 in a portion for forming a bit line region consisting of a portion for forming a source region of the MOS-type transistor and a region formed in continuity with the source region in the D-RAM, and thereafter the substance is heated in an oxidizing atmosphere of about 600° to 1000° C. Since, at this time, the portion of the titanium silicide film 14 covered by the oxidation-resistant mask 18 is not exposed to the oxidizing atmosphere, the same is not oxidized and remains as a titanium silicide film 14a, while the other portion of the titanium silicide film 14 not covered by the oxidation-resistant mask 18 is exposed to the oxidizing atmosphere to be oxidized and converted into a composite oxide film 19 of titanium oxide (TiO$_x$) and silicon oxide (SiO$_x$).

More specifically, the aforementioned conversion of the titanium silicide film 14 into the composite oxide film 19 is performed in the following manner: Since titanium is dominantly oxidized when the titanium silicide film 14 is heated to a temperature lower than 700° C. while silicon is dominantly oxidized when the same is heated to a temperature higher than 900° C., first the titanium silicide film 14 is oxidized at a temperature lower than 700° C. so that the oxidizing process of titanium silicide (TiSi$_x$) proceeds with the time in order of TiSi$_x$/Si→TiO$_x$/TiSi$_x$/Si→TiO$_x$/Si, and thereafter the temperature is raised to exceed 900° C., whereby TiO$_x$/Si is converted into TiO$_x$/SiO$_2$/Si to provide the composite oxide film 19 in which a layer of silicon dioxide (SiO$_2$) is formed between a titanium oxide (TiO$_x$) layer and the silicon substance.

Then, as shown in FIG. 8, a polycrystalline silicon film is formed by low pressure chemical vapor deposition (LPCVD), followed by introduction thereinto of impurities such as phosphor for reducing its resistance by a thermal diffusion method, thereby to form a first gate electrode 20, which serves as one electrode of the capacitor in the D-RAM, by photolithography and etching. Then the exposed portion of the composite oxide film 19 is removed by etching in a self-aligning manner employing the first gate electrode 20 and the oxidation-resistant mask 18 as masks. At this time, the portion of the composite oxide film 19 remaining beneath the first gate electrode 20 is adapted to serve as the dielectric material 19a for the capacitor in the D-RAM.

Figure 9:
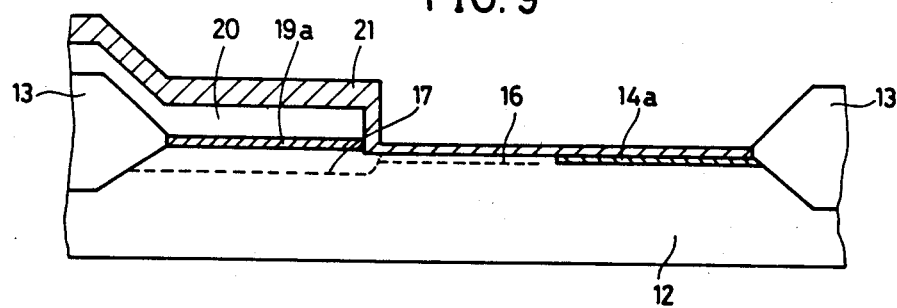

Then, as shown in FIG. 9, the oxidation-resistant mask 18 is removed, followed by heating in an oxidizing atmosphere of about 900° to 1000° C. for forming a silicon oxide film 21 over the entire main surface of the semiconductor substrate 12. Although the silicon oxide film 21 is formed also on the surface of the titanium silicide layer 14a, the titanium silicide layer 14a remains beneath the oxide film 21.

Figure 10:
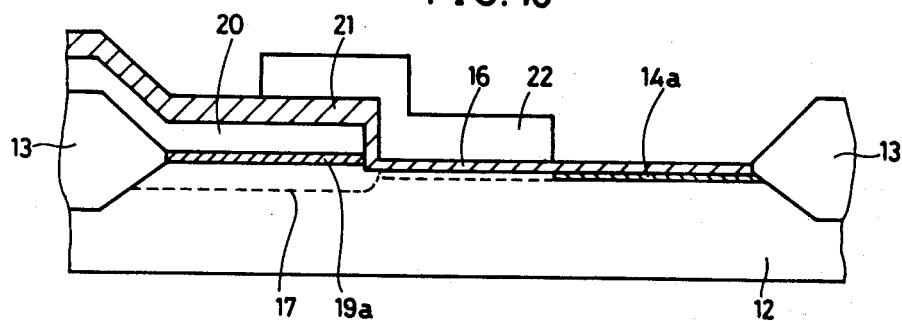

Then, as shown in FIG. 10, a polycrystalline silicon film is formed on the upper surface of the silicon oxide film 21 by a method such as LPCVD, followed by introduction thereinto of impurities such as phosphor by the thermal diffusion method etc. for reducing its resistance, thereby to form by photolithography and etching a second gate electrode 22 which serves as a gate electrode of the MOS-type transistor of the D-RAM.

Figure 11:
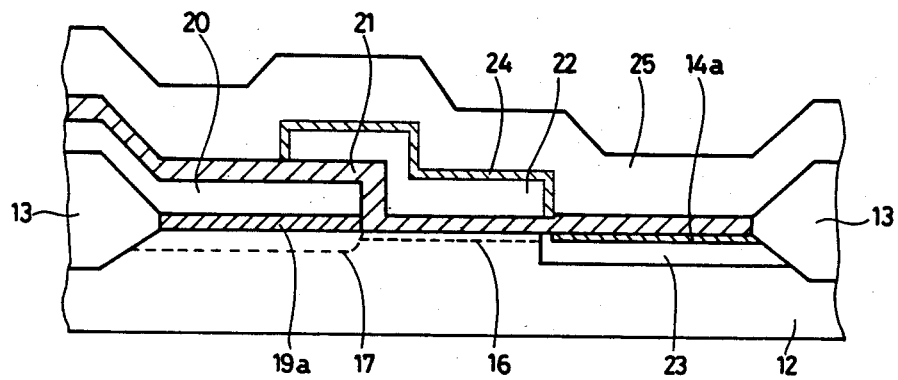

Then, as shown in FIG. 11, n-type impurities such as arsenic (As) are injected by ion implantation to the portion beneath the titanium silicide layer 14a which is adapted to reduce the resistance of the bit line region consisting of the source region of the MOS-type transistor and the region formed in continuity with the source region in the D-RAM, for forming a bit line region 23 which serves also as a source region. At this time, at least the source region in the bit line region 23 is selfaligned by the second gate electrode 22 and the field oxide film 13. Thereafter a thin silicon oxide film 24 of about 50 to 100 Å thickness is formed on the surface of the second gate electrode 22 by thermal oxidation etc. At this time, the film thickness of the silicon oxide film 21 on the upper surface of the titanium silicide layer 14a is also increased. Then, a thick silicon oxide film 25 including phosphor etc. is formed by a method such as CVD, followed by steps of forming contacts, aluminum wires and a passivation film thereby to complete the D-RAM.

The D-RAM thus structured in accordance with the present invention operates similarly to the conventional D-RAM. For example, in writing "H" a first logic level "H", represented by a high voltage for example, the MOS-type transistor of a selected memory cell is made conductive so that electric charges are stored in the capacitor portion formed with the first gate electrode 20, the composite oxide film 19a and the portion of the surface of the semiconductor substrate 12 right under the first gate electrode 20 and a capacitor portion at the p-n junction 17 through the bit line formed with the low-resistance titanium silicide layer 14a and the bit line region 23 and the conducted MOS-type transistor, whereby "H" is written in the memory cell. In reading of the written "H", the electric charges stored in the capacitor portion are read through the conducted MOS-type transistor and the bit line. Similar operation is performed with respect to writing and reading a second logic level "L", represented for example by a low voltage level.

The D-RAM thus formed in the aforementioned structure has the following advantages:

First, since the composite oxide film 19a of the titanium oxide film and the silicon oxide film is employed in the D-RAM as the dielectric material for the capacitor, the dielectric constant is 85.8 to 170 when titanium dioxide ($TiO_2$) is employed for the titanium oxide film, which dielectric constant value is 19 to 38 times as large as that of silicon dioxide of 4.5 to 4.6. Further, since the silicon oxide film is provided under the titanium oxide film, the interface with the semiconductor substrate 12 is stabilized while the electrical breakdown voltage characteristic resistance of the insulating film is improved in the capacitor. Consequently, the amount of the electric charges storable in the capacitor is increased even in a small area, and thus the difference between "H" and "L" voltage levels can be made large, whereby malfunction of the D-RAM is prevented.

Second, since the bit line including the source region of the MOS-type transistor and the bit line region formed in continuity with the source region is formed with the impurity region provided on the main surface of the semiconductor substrate and the titanium silicide layer 14a which is in ohmic contact with the impurity region in the D-RAM, the resistance of the bit line is remarkably lowered. Therefore, bit line loss can be extremely reduced, while high-speed operation is enabled for reading and writing.

Third, since the dielectric material for the capacitor and the titanium silicide layer 14a for reducing the resistance of the source region of the MOS-type transistor and the bit line formed in continuity with the source region are made from the same starting material, i.e., titanium silicide, the members of formation steps can be reduced.

Although titanium is employed as the metal having a high melting point in the aforementioned embodiment, a similar effect can be obtained by utilizing other metals having high melting points such as tantalum (Ta).

Further, although the titanium thin film is silicidizied by thermal processing in a non-oxidation atmosphere for forming the titanium silicide thin film 14, such a titanium silicide thin film may be formed directly on the main surface of the semiconductor substrate 12 by methods such as sputtering and electron beam evaporation.

In addition, although the silicon semiconductor substrate is employed as the semiconductor substrate in the above embodiment, the semiconductor substrate may be made of germanium or gallium arsenide, with a titanium silicide film formed after formation of a silicon film on the semiconductor substrate.

Further, although a thermal oxidizing method is employed for forming the composite oxide film in the above embodiment, it can be formed by methods such as an anodizing method and a plasmatic oxidizing method.

Further, although the p-type semiconductor substrate is employed in the above embodiment, an n-type semiconductor substrate may also be utilized, with p-type regions and n-type regions provided inversely to the aforementioned embodiment.

In addition, although two kinds of insulating and conductive compounds of the metal having a high melting point are employed as the dielectric material for the capacitor and as the material for reducing the resistance of the bit line in the D-RAM respectively, such compounds are not restricted for these uses, and may be utilized as the dielectric material for the capacitor and the material for the wiring layer connected to the source region of the MOS-type transistor in the D-RAM. Further, the same can be utilized as the dielectric material for the capacitor and the material for an intermediate layer of multi-layered wiring layers in the D-RAM. The point is that the subject compounds may be applied to insulating and conductive layers on a semiconductor device in which the insulating and conductive layers are formed on a semiconductor substrate.

Although the above description of the embodiment has been made with respect to the D-RAM, the present invention is not restricted to the D-RAM, and may be applied, for example, to a semiconductor device comprising electrode layers formed on a semiconductor substrate in a complicated pattern such as those of teeth of a comb or radial forms. In this case, the electrode layer is made of a silicide of a metal having a high melting point and the insulating layer to be formed in the complicated pattern suited to the pattern of the electrode layer is made of a composite oxide composed of silicon oxide and oxide of the metal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing semiconductor devices comprising the steps of:
    preparing a semiconductor substrate (12) having a surface layer of silicon;
    forming a conductive thin film (14) of a silicide composed of a metal having a high melting point and silicon on said semiconductor substrate;

forming an oxidation-resistant mask (18) on a first portion (14a) of said conductive thin film (14); and converting a second, exposed, portion (19) of said conductive thin film (14) into an insulating film (19a) of a composite oxide composed of silicon oxide and oxide of said metal by first heating said conductive thin film to a temperature in a first range sufficiently low to provide predominant oxidation of the metal having a high melting point and, thereafter, heating the structure to a temperature in a second, higher, temperature range wherein silicon in said surface layer is predominantly oxidized.

2. A method as recited in claim 1 wherein said first heating step comprises a further step of selecting said first temperature range to be lower than 700° C., and said second heating step comprises the step of selecting said second temperature range to be higher than 900° C.

3. A method as recited in claim 1 comprising the further step of selecting titanium as the metal having a high melting point and a further step of selecting said first temperature range to be lower than 700° C., and said second heating step comprises the step of selecting said second temperature range to be higher than 900° C.

4. A method as recited in claim 3 wherein said step of first heating said conductive thin film to a temperature in a first range is selected to provide an oxidizing process including the substeps of
    (a) converting $TiSi_x/Si$ to $TiO_x/TiSi_x/Si$ and
    (b) converting $TiO_x/TiSi_x/Si$ to $TiO_x/Si$, and
    wherein said step of heating the structure to a temperature in a second, higher temperature range is selected to convert $TiO_x/Si$ to $TiO_x/SiO_2/Si$.

5. A method as recited in claim 1 wherein said steps of heating said conductive thin film to temperature in a first range and thereafter to temperatures in a second range are selected to provide from a conductive metal silicide film the insulating composite oxide film in which a layer of the oxide of said metal is provided on a layer of silicon dioxide provided on the substrate.

6. A method of manufacturing a semiconductor device in accordance with claim 5, wherein
    said semiconductor substrate (12) is made of silicon, and
    said conductive thin film (14) of said silicide is formed by the steps of:
    forming a thin film of said metal on said silicon substrate; and
    reacting said thin film of said metal with said silicon substrate for silicidizing the same.

7. A method of manufacturing a semiconductor device in accordance with claim 5, wherein
    said semiconductor substrate (12) is made of one of components other than silicon including germanium or gallium arsenide, and
    said conductive thin film (14) of said silicide is formed by the steps of:
    forming a film of silicon on said substrate,
    forming a film of said metal on said film of silicon, and
    reacting said film of said metal with said film of silicon for silicidizing the same.

8. A method of manufacturing a semiconductor device comprising the steps of:
    forming a semiconductor substrate of silicon;
    forming a thick field oxide film in a predetermined pattern on a main surface of said semiconductor substrate;
    forming on an exposed portion of said main surface of said substrate a thin film of a metal having a high melting point;
    forming on said main surface a conductive metal silicide thin film of said metal and of silicon;
    injecting impurities of the same conductivity type as said substrate into a first predetermined portion of said main surface of said main substrate to form an impurity layer therein;
    injecting impurities of an opposite conductivity type to the substrate into a second portion of the main surface of said substrate thereby forming a p-n junction therewith;
    forming an oxidation resistant mask on a first portion of the conductive metal silicide thin film;
    forming, from a second, exposed, portion of the conductive thin film not covered by said oxidation resistant mask a composite oxide film acting as an insulator and including a metal oxide layer and a semiconductor oxide layer wherein said step of forming said composite oxide film comprises the step of heating said semiconductor device thereby oxidizing said second portion of the conductive thin film not covered by said oxidation resistant mask, said step of heating said semiconductor device thereby oxidizing said second portion of the conductive film not covered by said oxidation resistant mask comprising the further steps of first heating said device to a temperature greater than an oxidation temperature for said metal and thereafter heating said device to a temperature greater than an oxidation temperature for silicon thereby to convert said conductive thin film to said insulating film of composite oxide; and
    forming said semiconductor of silicon.

9. A method of manufacturing a semiconductor device comprising the steps of:
    forming a thick field oxide film in a predetermined pattern on a main surface of a semiconductor substrate;
    forming on an exposed portion of said main surface of said substrate a thin film of a metal having a high melting point;
    forming on said main surface a conductive metal silicide thin film of said metal and of silicon;
    injecting impurities of the same conductivity type as said substrate into a first predetermined portion of said main surface of said main substrate to form an impurity layer therein;
    injecting impurities of an opposite conductivity type to the substrate into a second portion of the main surface of said substrate thereby forming a p-n junction therewith;
    forming an oxidation resistant mask on a first portion of the conductive metal silicide thin film;
    forming, from a second, exposed, portion of the conductive thin film not covered by said oxidation resistant mask a composite oxide film acting as an insulator and including a metal oxide layer and a semiconductor oxide layer by heating said semiconductor device thereby oxidizing said second portion of the conductive thin film not covered by said oxidation resistant mask; and
    said step of heating said semiconductor device thereby ozidizing said second portion of the conductive film comprising the further steps of first heating said device to a temperature greater than an oxidation temperature for said metal and thereafter heating said device to a temperature greater than an oxidation temperature for silicon thereby to convert said conductive thin film to said insulating film of composite oxide.

10. A method of manufacturing a semicondutor device comprising the steps of:

forming a thick field oxide film in a predetermined pattern on a main surface of a semiconductor substrate;

forming on an exposed portion of said main surface of said substrate a thin film of a metal having a high melting point;

forming on said main surface a conductive metal silicide thin film of said metal and of silicon;

injecting impurities of the same conductivity type as said substrate into a first predetermined portion of said main surface of said main substrate to form an impurity layer therein;

injecting impurities of an opposite conductivity type to the substrate into a second portion of the main surface of said substrate thereby forming a p-n junction therewith;

forming an oxidation resistant mask on a first portion of the conductive metal silicide thin film;

forming, from a second, exposed, portion of the conductive thin film not covered by said oxidation resistant mask a composite oxide film acting as an insulator and including a metal oxide layer and a semiconductor oxide layer;

said step of forming on said main surface a conductive metal silicide thin film comprises the step of heating the thin film of metal formed on said main surface, and said main surface, in a nonoxidation atmosphere to a temperature in excess of a melting point of said metal, thereby forming on an exposed surface of the substrate said conductive metal silicide thin film, while maintaining portions of said thin film on the thick field oxide in a non-reacted state, and wherein the non-reacted thin film is subsequently removed from the thick field oxide film in a selfaligning manner;

said step of forming said composite oxide film comprising the further step of heating said semiconductor device thereby oxidizing said second portion of the conductive thin film not covered by said oxidation resistant mask by first heating said device to a temperature greater than an oxidation temperature for said metal and thereafter heating said device to a temperature greater than an oxidation temperature for silicon thereby to convert said conductive thin film to said insulating film of composite oxide.

11. A method of manufacturing a semiconductor device comprising the steps of:

forming a thick field oxide film in a predetermined pattern on a main surface of a semiconductor substrate;

forming on an exposed portion of said main surface of said substrate a thin film of a metal having a high melting point;

forming on said main surface a conductive metal silicide thin film of said metal and of silicon;

injecting impurities of the same conductivity type as said substrate into a first predetermined portion of said main surface of said main substrate to form an impurity layer therein;

injecting impurities of an opposite conductivity type to the substrate into a second portion of the main surface of said substrate thereby forming a p-n junction therewith;

forming an oxidation resistant mask on a first portion of the conductive metal silicide thin film;

forming, from a second, exposed, portion of the conductive thin film not covered by said oxidation resistant mask a composite oxide film acting as an insulator and including a metal oxide layer and a semiconductor oxide layer;

said step of forming on said main surface a conductive metal silicide thin film comprising the further step of heating the thin film of metal formed on said main surface, and said main surface, in a nonoxidation atmosphere to a temperature in excess of a melting point of said metal, thereby forming on an exposed surface of the substrate said conductive metal silicide thin film, while maintaining portions of said thin film on the thick field oxide in a non-reacted state, and wherein the non-reacted thin film is subsequently removed from the thick field oxide film in a selfaligning manner; and said metal being selected to have a first oxidation temperature lower than an oxidation temperature for silicon.

12. A method of manufacturing a semiconductor device comprising the steps of:

forming a thick field oxide film in a predetermined pattern on a main surface of a semiconductor substrate;

forming on an exposed portion of said main surface of said substrate a thin film of a metal having a high melting point;

forming on said main surface a conductive metal silicide thin film of said metal and of silicon;

injecting impurities of the same conductivity type as said substrate into a first predetermined portion of said main surface of said main substrate to form an impurity layer therein;

injecting impurities of an opposite conductivity type to the substrate into a second portion of the main surface of said substrate thereby forming a p-n junction therewith;

forming an oxidation resistant mask on a first portion of the conductive metal silicide thin film;

forming, from a second, exposed, portion of the conductive thin film not covered by said oxidation resistant mask a composite oxide film acting as an insulator and including a metal oxide layer and a semiconductor oxide layer;

said step of forming on said main surface a conductive metal silicide thin film comprising the further step of heating the thin film of metal formed on said main surface, and said main surface, in a nonoxidation atmosphere to a temperature in excess of a melting point of said metal, thereby forming on an exposed surface of the substrate said conductive metal silicide thin film, while maintaining portions of said thin film on the thick field oxide in a non-reacted state, and wherein the non-reacted thin film is subsequently removed from the thick field oxide film in a selfaligning manner;

said step of forming said composite oxide film comprising the further step of heating said semiconductor device thereby oxidizing said second portion of the conductive thin film not covered by said oxidation resistant mask;

by first heating said device to a temperature greater than an oxidation temperature for said metal and thereafter heating said device to a temperature greater than an oxidation temperature for silicon thereby to convert said conductive thin film to said insulating film of composite oxide; and said metal is selected to have a first oxidation temperature lower than an oxidation temperature for silicon.

13. A method of manufacturing a semiconductor device comprising the steps of:

forming a thick field oxide film in a predetermined pattern on a main surface of a semiconductor substrate;

forming on an exposed portion of said main surface of said substrate a thin film of a metal having a high melting point;

forming on said main surface a conductive metal silicide thin film of said metal and of silicon;

injecting impurities of the same conductivity type as said substrate into a first predetermined portion of said main surface of said main substrate to form an impurity layer therein;

injecting impurities of an opposite conductivity type to the substrate into a second portion of the main surface of said substrate thereby forming a p-n junction therewith;

forming an oxidation resistant mask on a first portion of the conductive metal silicide thin film;

forming, from a second, exposed, portion of the conductive thin film not covered by said oxidation resistant mask a composite oxide film acting as an insulator and including a metal oxide layer and a semiconductor oxide layer;

said step of forming on said main surface a conductive metal silicide thin film comprising the further step of heating the thin film of metal formed on said main surface, and said main surface, in a nonoxidation atmosphere to a temperature in excess of a melting point of said metal, thereby forming on an exposed surface of the substrate said conductive metal silicide thin film, while maintaining portions of said thin film on the thick field oxide in a non-reacted state, and wherein the non-reacted thin film is subsequently removed from the thick field oxide film in a selfaligning manner;

said step of forming said composite oxide film comprising the further step of heating said semiconductor device thereby oxidizing said second portion of the conductive thin film not covered by said oxidation resistant mask; and said second mentioned heating step comprising the step of first heating the device to a temperature exceeding a first oxidation temperature and thereafter increasing the temperature to a temperature exceeding a second oxidation temperature, thereby first predominantly oxidizing said metal component of said silicide and thereafter predominantly oxidizing said silicon component of said silicide to form a composite oxide film having a metal oxide layer over a semiconductor oxide layer.

14. A method of manufacturing a semiconductor memory device having a plurality of cells each comprising a MOS-type field effect transistor and a capacitor, a low resistance material in a source region of said transistor forming a conductive thin film, and a dielectric material for said capacitor forming an insulating film, comprising the steps of preparing a semiconductor substrate (12) having a surface layer of silicon;

forming a conductive thin film (14) of a silicide composed of a metal having a high melting point and silicon on said semiconductor substrate;

forming an oxidation-resistant mask (18) on a first portion (14a) of said conductive thin film (14); and converting a second, exposed, portion (19) of said conductive thin film (14) into an insulating film (19a) of a composite oxide composed of silicon oxide and oxide of said metal by first heating said conductive thin film to a temperature in a first range sufficiently low to provide predominant oxidation of the metal having a high melting point and, thereafter, heating the structure to a temperature in a second, higher, temperature range wherein silicon in said surface layer is predominantly oxidized.

* * * * *